United States Patent
Maushard et al.

(10) Patent No.: US 6,803,700 B2
(45) Date of Patent: Oct. 12, 2004

(54) PIEZOELECTRIC DEVICE

(75) Inventors: Jerry P. Maushard, Mapleton, IL (US); L. Glenn Waterfield, Peoria, IL (US)

(73) Assignee: Caterpillar Inc., Peoria, IL (US)

( * ) Notice: Subject to any disclaimer, the term of this patent is extended or adjusted under 35 U.S.C. 154(b) by 17 days.

(21) Appl. No.: 10/163,518

(22) Filed: Jun. 6, 2002

(65) Prior Publication Data

US 2003/0227233 A1 Dec. 11, 2003

(51) Int. Cl.$^7$ ............................................... H01L 41/08
(52) U.S. Cl. ..................................... 310/330; 310/331
(58) Field of Search .................................. 310/330, 331

(56) References Cited

U.S. PATENT DOCUMENTS

| | | | | |
|---|---|---|---|---|
| 2,388,242 A | * | 11/1945 | Arndt, Jr. ................... | 310/331 |
| 2,524,579 A | * | 10/1950 | Taylor ........................ | 310/330 |
| 2,983,902 A | * | 5/1961 | Phillipps .................... | 340/7.62 |
| 4,156,800 A | * | 5/1979 | Sear et al. .................. | 381/114 |
| 5,068,018 A | * | 11/1991 | Carlson ...................... | 204/554 |
| 5,083,056 A | * | 1/1992 | Kondou et al. ............. | 310/332 |
| 5,471,721 A | * | 12/1995 | Haertling ................... | 29/25.35 |
| 5,632,841 A | | 5/1997 | Hellbaum et al. .......... | 156/245 |
| 5,691,593 A | * | 11/1997 | Takeuchi et al. ............ | 310/328 |
| 5,815,466 A | | 9/1998 | Erath ......................... | 330/331 |
| 5,834,650 A | * | 11/1998 | Kim ............................ | 73/651 |
| 6,024,340 A | | 2/2000 | Lazarus et al. ........ | 251/129.06 |
| 6,060,811 A | | 5/2000 | Fox et al. ................... | 310/311 |
| 6,182,340 B1 | | 2/2001 | Bishop ..................... | 29/25.35 |
| 6,318,497 B1 | | 11/2001 | De Groot et al. ........... | 181/110 |

* cited by examiner

*Primary Examiner*—Thomas M. Dougherty
(74) *Attorney, Agent, or Firm*—Kelsey L. Milman; Leill & McNeil

(57) ABSTRACT

A pre-stressed piezoelectric actuator is comprised of a plurality of layers. The layers include at least one electrically-active ceramic layer, a reinforcing substrate, and a top layer. Preferably, the top layer is comprised of a copper material having at least one lead integrally formed therewith, the lead being available for attaching the device to a voltage source. The copper layer further has a plurality of apertures defined therein to compensate for the stiffness of the copper and to allow the copper layer to deform. The layers are bonded by a thermally-activated adhesive. When the layers and adhesive are heated and cooled, the higher coefficients of thermal expansion in the substrate and top layers stresses the ceramic and causes the device to cool into an arcuate shape.

13 Claims, 4 Drawing Sheets

PIEZOELECTRIC DEVICE

TECHNICAL FIELD

This invention relates generally to piezoelectric actuators and, more specifically, to a prestressed piezoelectric actuator having an integral lead.

BACKGROUND

Piezoelectric devices, such as piezoelectric benders or actuators, generally consist of a piezoelectric material that deforms when an electric field is applied across it. Additional materials may be bonded with the piezoelectric material, such as metallic layers that act as electrodes, insulating materials to prevent current from flowing between particular areas of the device, and adhesives to bond the various layers together.

A typical piezoelectric device, such as a piezoelectric bender, may be comprised of an electroactive layer, such as various types of ceramics, disposed between a reinforcing layer and a top or conductive layer, although other configurations, such as electroplating, are also possible. The bender may be pre-stressed by ways known to those skilled in the art to have a domed, or arcuate, configuration.

A representative pre-stressed piezoelectric bender is seen in U.S. Pat. No. 5,632,841. The bender is a composite structure constructed with a piezoelectric ceramic layer which is electroplated on its two major faces. A metal reinforcing layer is adhered to the electroplated surface on at least one side of the ceramic layer by an adhesive layer. During manufacture of the bender, the ceramic layer, the adhesive layer and the reinforcing layer are simultaneously heated to a temperature above the melting point of the adhesive, and then subsequently allowed to cool, thereby re-solidifying and setting the adhesive layer. During the cooling process the ceramic layer becomes strained and deforms in an arcuate shape having a normally concave face due to the higher coefficients of thermal contraction of the reinforcing layer and the adhesive layer than of the ceramic layer.

In conjunction with the bender disclosed by U.S. Pat. No. 5,632,841, or with other benders, whether thermally, mechanically or otherwise prestressed, it is also generally known in the art to provide a top layer of an aluminum material adhered to the ceramic layer to protect the ceramic and assist in controlling the amount of pre-stressing present in the ceramic layer. Aluminum, which is a relatively inexpensive material, has a modulus of elasticity (or Young's modulus) which may be greater than or similar to the modulus of the ceramic material; thus, providing an aluminum top layer increases the stiffness of the bender and limits the doming of the bender. In addition, the aluminum layer may act as a protective cover for the ceramic layer and for any leads adhered to the ceramic layer. Conductive leads, which supply the necessary voltage to the ceramic, are typically adhered to the ceramic layer under the aluminum layer. However, due to the differing thickness within the bender from the adhered lead, stress may accumulate in the area of the adhered lead, and this area may be a point of failure of the bender.

Accordingly, the present invention is directed to overcoming one or more of the problems as set forth above.

SUMMARY OF THE INVENTION

In a first embodiment, a piezoelectric bender is disclosed, the bender comprising at least one layer of an electrically active ceramic, at least one layer of a copper material, and at least one layer of a substrate, wherein the ceramic layer is disposed between the copper layer and the substrate layer.

In a second embodiment, a piezoelectric bender is disclosed, the bender comprising a first layer having a plurality of apertures defined therein and a second layer adhered to the first layer.

In a third embodiment, a piezoelectric bender is disclosed, the bender comprising a first layer having a lead formed integrally therewith and a second layer adhered to the first layer.

These and other aspects and advantages associated with the present invention will become apparent to those skilled in the art upon reading the following detailed description in connection with the drawings and appended claims.

DETAILED DESCRIPTION

The following is a detailed description of the best mode embodiment of the present invention, with sufficient detail to permit someone skilled in the art to make and use the claimed invention. The present invention, however, is not limited to the embodiment disclosed and described herein. To the contrary, the present invention may include all those alternative embodiments and equivalents that fall within the scope of the present invention as defined by the appended claims.

Figure 1:
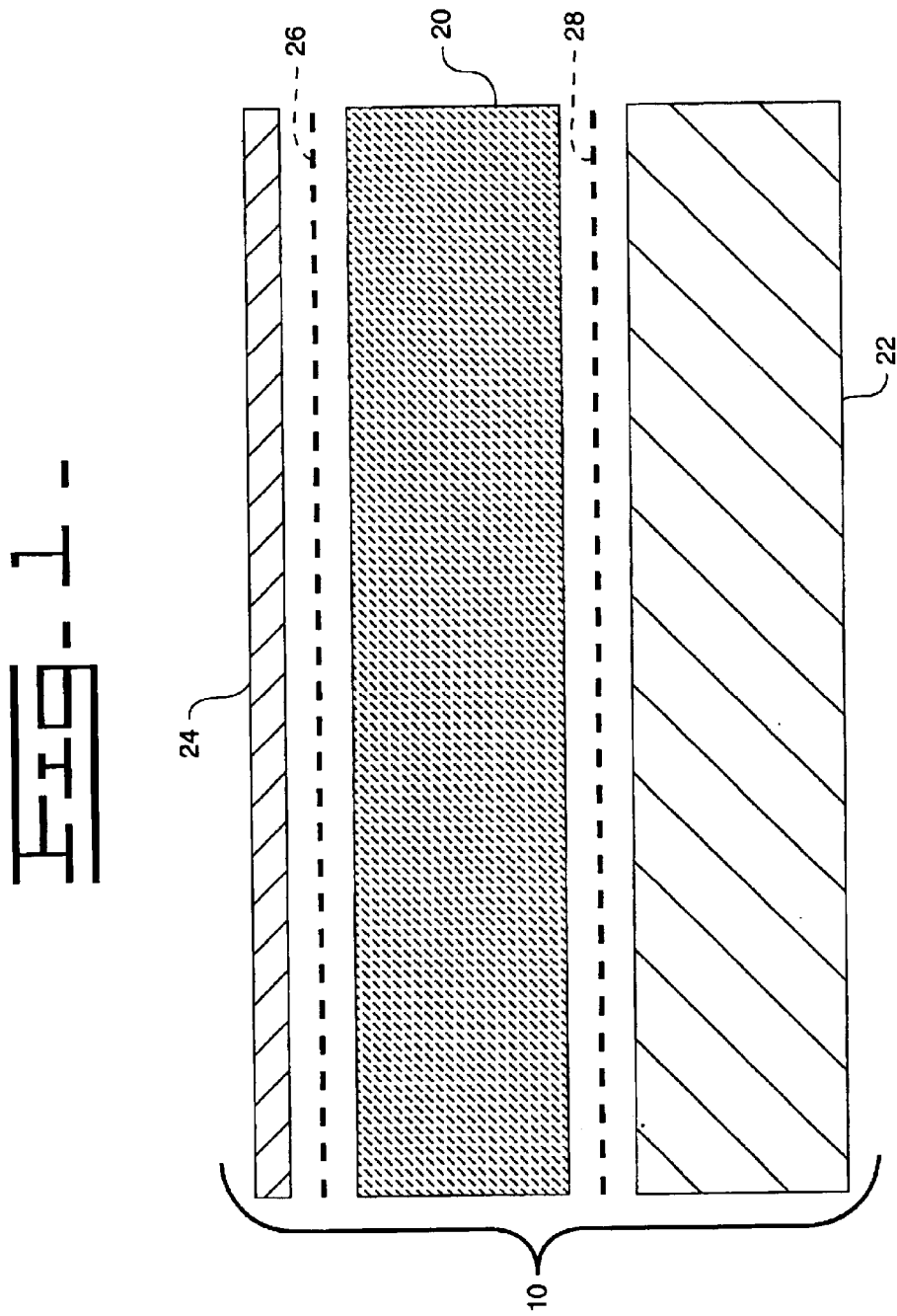
FIG. 1 is a representation of the layers of the bender consistent with an exemplary embodiment of the present invention.

FIG. 1 illustrates a bender consistent with an exemplary embodiment of the present invention and generally designated 10. The bender 10 is preferably comprised of first, second, and third layers 20, 24, and 22 and two adhesive layers 26 and 28. The first, or ceramic, layer 20 is preferably comprised of any electrically-active ceramic material, such as piezoelectric, electrostrictive or other ferroelectric ceramics. The second, or top, layer 24 is preferably comprised of a copper material. The third, or substrate, layer 22 may be comprised of virtually any material, such as fiberglass, beryllium, copper, graphite, steel, etc. However, the substrate layer is preferably comprised of a conductive material, and carbon steel is the preferred material due, at least in part, to its coefficient of thermal expansion and modulus of elasticity. The substrate layer 22 may provide reinforcement to the bender 10. The ceramic layer 20 is preferably sandwiched between the substrate layer 22 and the top layer 24. The layers forming the bender 10 may be circular, rectangular, square or any other regular or irregular shape; however, a circular shape is preferred.

Preferably, adhesive layers 26 and 28 are applied between the top and ceramic layers 24 and 20 and between the ceramic and substrate layers 20 and 22, respectively, and may be comprised of any thermally-activated adhesive. When the stacked layers 22, 28, 20, 26, and 24 are heated to an elevated temperature, the adhesive layers 26 and 28 begin to flow. Upon cooling of the bender 10 to ambient temperature, the top, ceramic, and substrate layers 24, 20, and 22 are bonded by the adhesive layer 26 and 28 to form an integrally bonded, multiple layer laminate, i.e. the bender 10. The temperature to which the bender 10 must be heated to activate the adhesive depends upon the particular adhesive used, but the temperature is typically in the range of about 100 C. to about 300 C. Thermal set epoxies typically require heating in the lower end of this range, whereas hot melt thermal plastic typically requires the higher activation temperatures.

Figure 2:
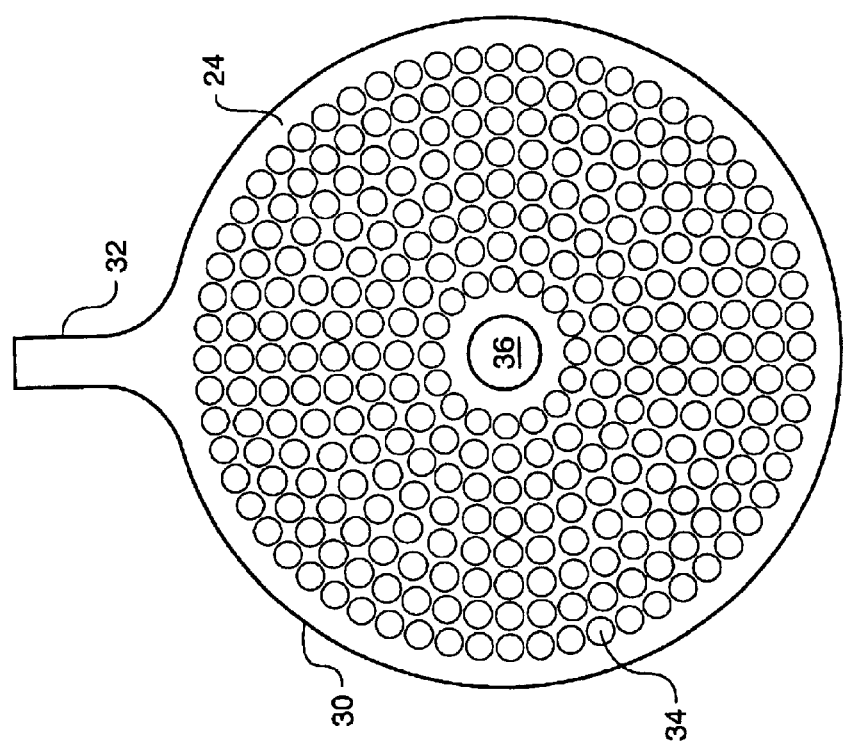
FIG. 2 is a top view of the top layer of the bender consistent with an exemplary embodiment of the present invention.

As seen in FIG. 2, the second, or top, layer 24 of the bender is preferably comprised of a disk portion 30 and a lead portion 32. The disk portion 32 is preferably adhered to the ceramic layer 20 by the layer of adhesive 26, and the lead portion 32 preferably hangs freely (as is more readily seen in FIG. 3).

Preferably, the disk portion 30 includes a plurality of apertures 34 and a center aperture 36 defined therein. The apertures 34 and 36 may be formed by any known metal-working technique, such as for example by stamping or cutting. The apertures 34 and 36 are shown as being generally circular, but they may be any regular or irregular shape. The disk portion 30, which as stated is bonded or otherwise attached with the ceramic layer 20 deflects in conjunction with the ceramic layer 20 when it is excited, i.e. when a voltage is applied across the ceramic layer 20. However, copper typically is a stiffer material than the ceramic material; for example, the modulus of elasticity of copper is approximately 119 GPa, and the modulus of elasticity of a typical ceramic for use in the piezoelectric bender 10 may be 67 GPa. Thus, the ceramic layer 20 tends to bend more readily than the copper layer 24, and the copper layer 24 may resist the actuation of the ceramic layer 20 and prevent the bender 10 from actuating to the extent intended from the voltage applied to the ceramic layer 20. Thus, the disk portion 30 of the copper layer 24 has the plurality of apertures 34 and 36 defined therein to lessen the resistance to bending when the ceramic layer 20 is excited. Preferably, the apertures 34 and 36 comprise approximately one-half of the surface area of the disk portion 30, although other amounts of coverage may be appropriate depending on the application of the bender 10 and the desired deflection of the bender 10.

The lead portion 32 forms a lead by which the bender may be connected to a positive or negative voltage source 40 or 42 to apply a voltage to and excite the electrically-active ceramic. As can be readily seen in FIG. 2, the lead portion 32 is integrally formed from the copper material forming the top layer 24; preferably, no adhesive or other means are necessary for connecting the lead portion 32 to the disk portion 30. Thus, the lead does not increase the thickness of a portion of the bender 10, which lessens the concentration of stress and failure due to fatigue in the lead.

Figure 3:
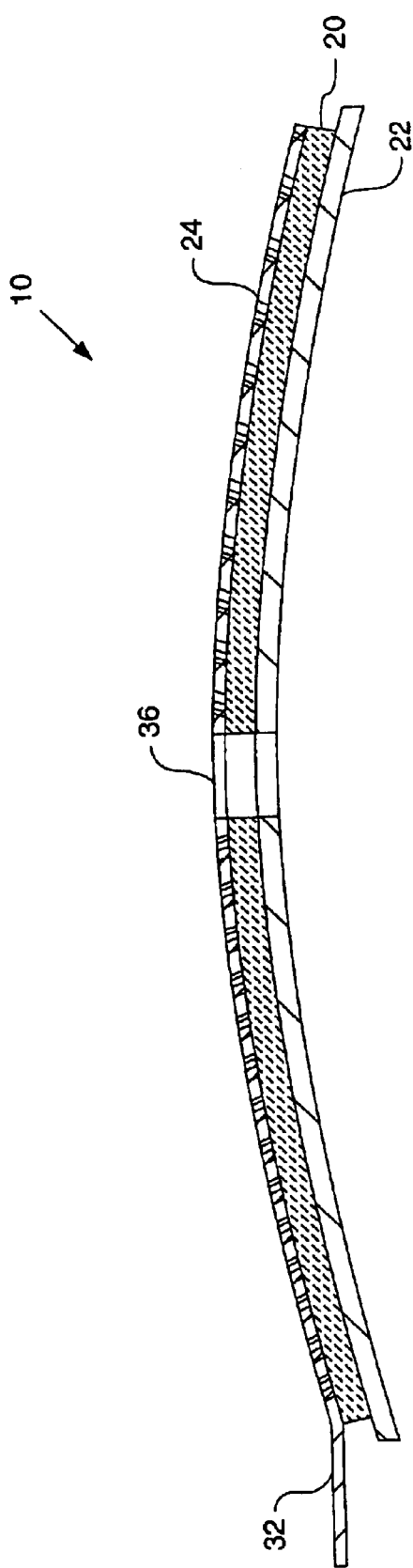
FIG. 3 is a cross sectional view of the bender consistent with an exemplary embodiment of the present invention.

As seen in FIG. 3, the bonded laminate, or bender 10, is preferably formed into an arcuate shape. Once the first, second, and third layers 24, 20, and 22 are stacked with the adhesive layers 26 and 28 applied, the bender 10 is heated, and the adhesive layers 26 and 28 begin to flow. The entire stacked assembly is then slowly cooled to ambient temperature, whereby the adhesive layers 26 and 28 reset and integrally bond the first, second, and third layers 24, 20, 22 together. The difference in the coefficients of thermal expansion of the copper, ceramic, and steel materials causes a slight doming of the bender 10 during cooling and results in large internal stresses. However, the bender 10 may also be formed into an arcuate shape through mechanical or other means.

Figure 4:
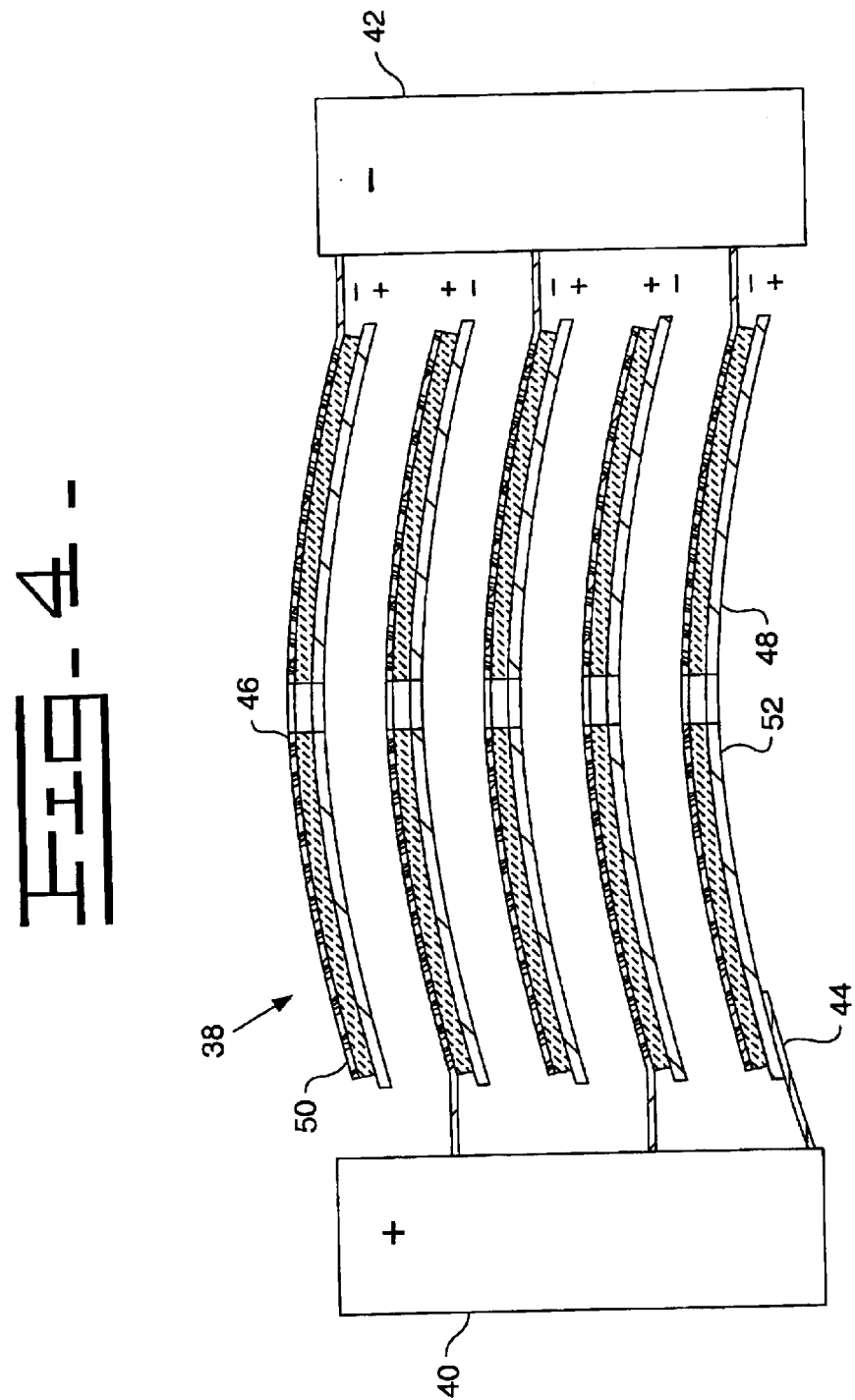
FIG. 4 is a representation of an actuator comprised of a plurality of stacked benders.

Further, a plurality of benders may be stacked in order to increase the mechanical output force beyond that which can be provided by a single piezoelectric bender. As seen in FIG. 4, the stack 38 of benders 10, which may be termed an actuator, are each comprised of the first, second, and third layers 20, 24, and 22 adhered to each other, as previously described. Alternatively, the layers 20, 24 and 22 of the benders may be clamped or otherwise held in proximity to each other. The stack 38 includes at least first and last benders 50 and 52, although the stack 38 may include any number of benders based upon the application and mechanical force needed. The stack 38 has a first and a second end 46 and 48. The first end is comprised of the first, or copper, layer 24 of the first bender 50, and the second end 48 is comprised of the third layer 22 of the last bender 52. Alternatively, if the benders have only first and second layers 22 and 20, the second end 48 may be comprised of the second layer 20 of the last bender 52.

In order to provide a voltage across the ceramic layers 20 of the benders 10, the layers 20 must each be conductively connected to a positive and negative voltage source 40 and 42. To accommodate this, the stacked benders 10 alternate between having their lead portions 32 connected to positive and negative voltage sources 40 and 42. Due to the substrate layer 22 of each of the benders 10 preferably being comprised of a conductive material and the adhesive layers 26 and 28 also preferably being conductive, the current passes through these layers to the ceramic layer 20, thus exciting the ceramic layer 20 and causing deflection of the actuator.

The electrically-active ceramic is poled to deflect in a particular direction when a positive voltage is applied across it and to deflect in the opposite direction when a negative voltage is applied across it. Therefore, the ceramic layers 20 for the benders 10 having leads connected to the negative voltage source 42 are inverted when they are disposed between the copper and substrate layers 24 and 22. Thus, all of the benders 10 comprising the actuator deflect in the same direction.

In addition, in order to allow the last bender 52 to have a voltage applied across its ceramic layer 20, a second lead 48 is disposed therewith and connected to the opposite voltage source from the integral lead. For example if the integral lead 32 of the last bender 52 is connected to the positive voltage source 40, the second lead 44 is connected to the negative voltage source 42 in order to provide a voltage across the ceramic layer 20. Preferably, the second lead 52, which may comprised of copper or other conductive material, is adhered or otherwise electrically connected to the second end 48 of the stack 38, which typically is the substrate layer 22, although the second lead 48 may also be sandwiched between the ceramic layer 20 and the substrate layer 22 of the last bender 52.

Industrial Applicability

In a first embodiment, a piezoelectric bender 10 is provided that lessens the concentration of the stresses inherent in the bender 10. A lead 32 is integrally formed in the top layer 24 of the bender 10, which is preferably comprised of a copper material, eliminating the need to attach a separate lead to the bender 10. To accommodate the stiffness of the copper material, a plurality of apertures 34 and 36 may be defined within the copper layer 24. The size and quantity of apertures 34 and 36 is typically dependent on the desired stiffness of the bender 10.

In a second embodiment, a plurality of benders may be stacked to provide greater mechanical force than that provided by a single bender 10.

It will be readily apparent to those skilled in the art that various changes and modifications of an obvious nature may be made, and all such changes and modifications are considered to fall within the scope of the appended claims. Other embodiments will be apparent to those skilled in the art from consideration of the specification and practice of the invention as disclosed herein. It is intended that the specification and examples be considered as exemplary only, with a true scope and spirit of the invention being indicated by the following claims and their equivalents.

What is claimed is:

1. A piezoelectric bender, comprising:
   a first layer including a plurality of aperture; and
   a second layer adhered to the first layer via an adhesive layer such that the first and second layers flex as a unit.

2. The bender, as set forth in claim 1, wherein the first layer is comprised of a conductive material.

3. The bender, as set forth in claim 2, wherein the first layer is comprised of a copper material and the second layer is comprised of an electrically-active ceramic.

4. The bender, as set forth in claim 3, wherein the first layer comprises:
   a disk portion including the plurality of apertures defined therein, the disk portion adhered to the second layer, and
   a lead portion.

5. The bender, as set forth in claim 4, wherein the lead portion is integrally formed from the copper material, the lead portion being available for supplying a voltage to the bender.

6. The bender, as set forth in claim 1, further comprising:
   a third layer adhered to the second layer via an additional adhesive layer such that the second and third layers flex as a unit.

7. The bender, as set forth in claim 6, wherein the adhered layers form an arcuate structure.

8. A piezoelectric bender, comprising:
   a first layer having an arcuate shaped portion and a lead formed integrally therewith; and
   a second layer of piezoelectric material adhered to the arcuate shaped portion of the first layer via an adhesive layer such that the first and second layers flex as a unit.

9. The bender, as set forth in claim 8, wherein the first layer is comprised of a conductive material.

10. The bender, as set forth in claim 9,
    wherein the first layer is comprised of a copper material,
    wherein the second layer is comprised of an electrically active ceramic, and
    wherein the lead is available for supplying a voltage to the bender.

11. The bender, as set forth in claim 10, wherein the first layer comprises:
    a lead portion forming the integral lead; and
    a disk portion including a plurality of apertures defined therein, the disk portion adhered to the second layer.

12. The bender, as set forth in claim 11, further comprising:
    third layer adhered to the second layer via an adhesive layer such that the second and third layers flex as a unit.

13. A piezoelectric bender, comprising:
    a first layer having a lead formed integrally therewith;
    a second layer adhered to the first layer;
    wherein the first layer is comprised of a conductive material;
    wherein the first layer is comprised of a copper material;
    wherein the second layer is comprised of an electrically active ceramic;
    wherein the lead is available for supplying a voltage to the bender;
    wherein the first layer comprises a lead portion forming the integral lead a disk portion including a plurality of apertures defined therein, the disk portion adhered to the second layer;
    a third layer adhered to the second layer, and
    wherein the adhered disk portion of the first layer, the second layer, and the third layer form an arcuate structure.

* * * * *